United States Patent
Candidus et al.

(10) Patent No.: US 10,698,045 B2
(45) Date of Patent: Jun. 30, 2020

(54) MAGNETIC RESONANCE COIL ARRANGEMENT WITH ADAPTIVE COIL SPACING LAYER

(71) Applicant: Siemens Healthcare GmbH, Erlangen (DE)

(72) Inventors: Yvonne Candidus, Fürth (DE); Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 13 days.

(21) Appl. No.: 16/000,626

(22) Filed: Jun. 5, 2018

(65) Prior Publication Data

US 2018/0372815 A1     Dec. 27, 2018

(30) Foreign Application Priority Data

Jun. 21, 2017   (DE) .................. 10 2017 210 422

(51) Int. Cl.
*G01R 33/3415* (2006.01)
*G01R 33/34* (2006.01)

(52) U.S. Cl.
CPC ... *G01R 33/3415* (2013.01); *G01R 33/34007* (2013.01); *G01R 33/34084* (2013.01)

(58) Field of Classification Search
CPC .......... G01R 33/3415; G01R 33/34084; G01R 33/34007
See application file for complete search history.

(56) References Cited

U.S. PATENT DOCUMENTS

| | | | |
|---|---|---|---|
| 6,438,402 B1 | 8/2002 | Hashoian et al. | |
| 7,826,887 B2 | 11/2010 | Driemel | |
| 8,244,328 B2 | 8/2012 | Biber et al. | |
| 9,138,164 B2 | 9/2015 | Driemel | |
| 2004/0227516 A1 | 11/2004 | Endt | |
| 2008/0204021 A1 | 8/2008 | Leussler et al. | |
| 2010/0053019 A1* | 3/2010 | Ikawa | H01P 3/088 343/866 |
| 2012/0256633 A1 | 10/2012 | Biber et al. | |
| 2013/0137969 A1* | 5/2013 | Jones | A61B 5/055 600/421 |
| 2015/0057527 A1 | 2/2015 | Driemel | |
| 2015/0057528 A1 | 2/2015 | Driemel | |

(Continued)

FOREIGN PATENT DOCUMENTS

| CN | 1525191 A | 9/2004 |
|---|---|---|
| CN | 1969195 A | 5/2007 |

(Continued)

OTHER PUBLICATIONS

Chinese Office Action for Chinese Application No. 201810636945.0 dated Apr. 15, 2020.

*Primary Examiner* — Douglas X Rodriguez
*Assistant Examiner* — Haidong Zhang
(74) *Attorney, Agent, or Firm* — Lempia Summerfield Katz LLC

(57) ABSTRACT

A coil arrangement for a magnetic resonance scanner with at least one coil spacing layer including a two-dimensional matrix with a flexible, network structure is described. The two-dimensional matrix has a plurality of flexibly interlinked substructures. A method for producing a coil arrangement is also described. Also described is a magnetic resonance imaging system.

15 Claims, 9 Drawing Sheets

(56) References Cited

U.S. PATENT DOCUMENTS

2016/0363642 A1 12/2016 Gall
2018/0017643 A1 1/2018 Zink
2018/0372816 A1 12/2018 Nowak

FOREIGN PATENT DOCUMENTS

| CN | 102288930 A | 12/2011 |
| CN | 208984790 U | 6/2019 |
| DE | 102011007065 A1 | 10/2012 |
| DE | 102015210529 A1 | 12/2016 |
| DE | 102016212724 A1 | 1/2018 |

* cited by examiner

FIG 11
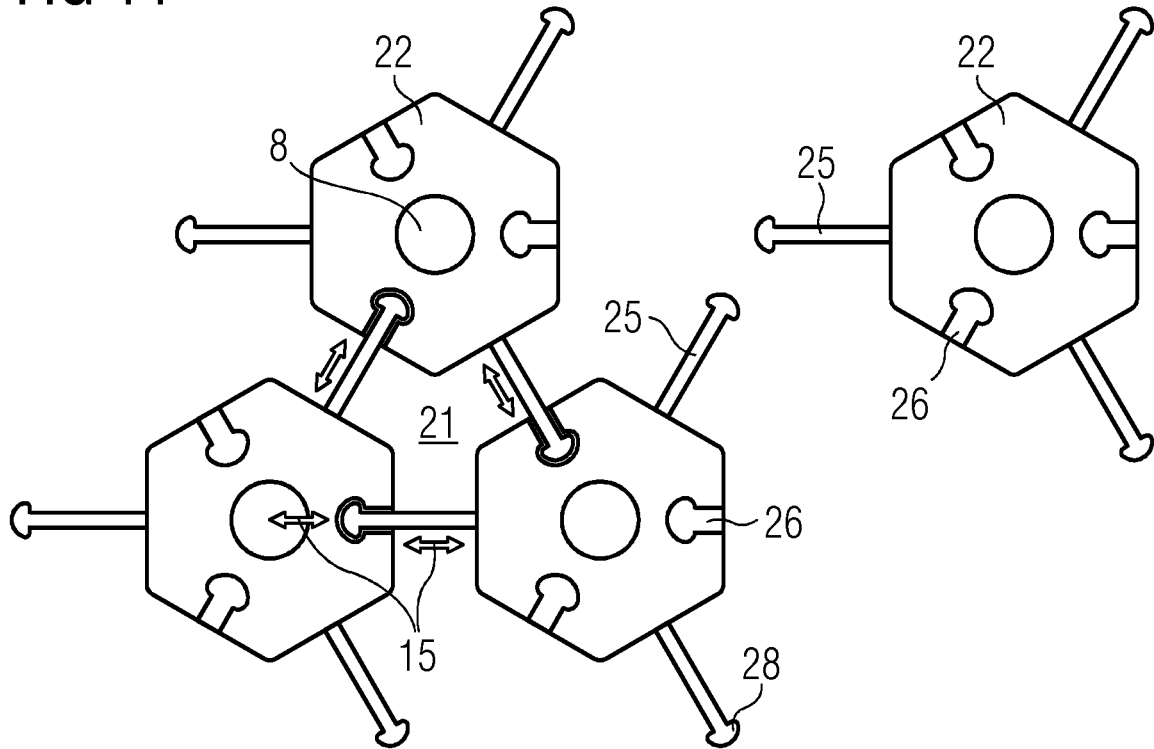
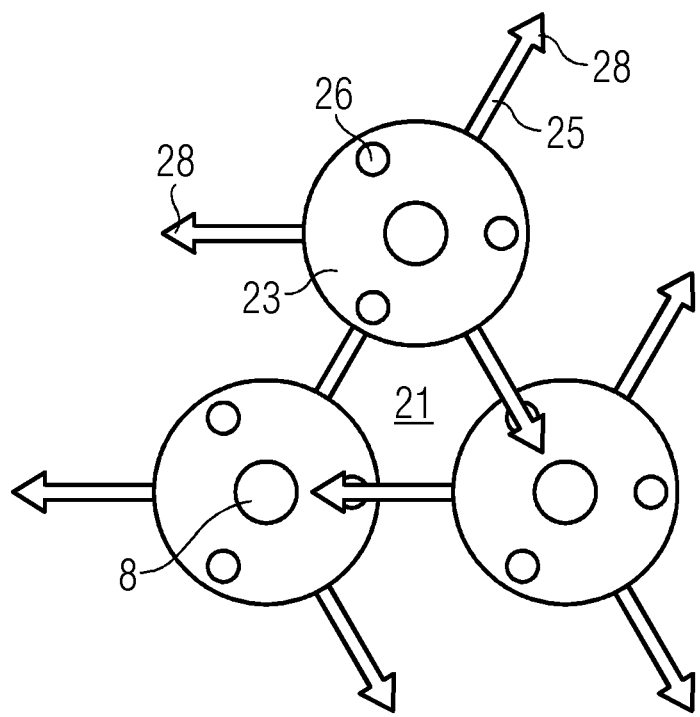

MAGNETIC RESONANCE COIL ARRANGEMENT WITH ADAPTIVE COIL SPACING LAYER

The application claims the benefit of German Patent Application No. DE 10 2017 210 422.8, filed Jun. 21, 2017, which is hereby incorporated by reference in its entirety.

TECHNICAL FIELD

The disclosure relates to a coil arrangement for a magnetic resonance imaging system. The disclosure furthermore relates to a method for producing such a coil arrangement. The disclosure also relates to a magnetic resonance imaging system.

BACKGROUND

Magnetic resonance scanners are imaging devices that, for mapping an examination object, align nuclear spins of the examination object with a strong external magnetic field and excite the nuclear spins to precession around this alignment via a magnetic alternating field. The precession or return of the spins from this excited state into a state with lower energy in turn generates in response a magnetic alternating field, also known as a magnetic resonance signal, which is received by antennas.

By magnetic gradient fields, spatial encoding is impressed on the signals and this subsequently enables allocation of the received signal to a volume element. The received signal is then evaluated and a three-dimensional imaging representation of the examination object is supplied.

Magnetic alternating fields having a frequency corresponding to the Larmor frequency at the respective static magnetic field strength and very high field strengths or outputs are required for excitation of the precession of the spins. Antennas, frequently called local coils, arranged directly on patient are used to improve to improve the signal-to-noise ratio of the magnetic resonance signal received by the antennas. Local coils may have a plurality of individual antennas, which may also be called coil elements. The coil elements may be embodied as coil loops.

However, individual patients differ considerably in their physiognomy with the result that, with a rigid local coil, either an optimum signal is obtained for a few patients only or it is necessary to keep available many local coils with different dimensions.

An aim in imaging is to bring the coils as close as possible to the patient, (e.g., to the body region to be examined), in order in this way to achieve the best possible signal-to-noise ratio. To this end, conventionally a differentiation is made between rigid coil types configured to a respective body region and flexible coil types.

Rigid coils may be used for head examinations and may be configured to the special anatomy of the head. Head coils are known, for example, from the publications U.S. Pat. No. 8,244,328 B2; U.S. Pat. No. 9,138,164 B2; U.S. Pat. No. 7,826,887 B2; U.S. Patent Application Publication No. 2015/0057527 A1; and U.S. Patent Application Publication No. 2015/0057528 A1. However, image quality may be degraded in the case of patients with small heads because the antenna structures are not optimally close to the anatomy.

Flexible coil structures may compensate lack of adaptation, but a conventional problem is that such arrangements also only enable three-dimensional conversions to a restricted extent. This results in bulging and the protrusion of sub-regions of the coil arrangement. For example, in the case of cylindrical body shapes, (e.g., knees or elbows), depending upon the diameter, there may be another overlap or a gap between two coil ends. As a result, the image quality achieved is not optimum.

German Patent Publication No. DE 10 2011 007 065 A1 discloses a knee coil, wherein the receiving part includes a rigid-flexible combination.

SUMMARY AND DESCRIPTION

The scope of the present disclosure is defined solely by the appended claims and is not affected to any degree by the statements within this description. The present embodiments may obviate one or more of the drawbacks or limitations in the related art.

It is the object of the disclosure to provide a local coil that achieves improved imaging results with different patients or different regions of a patient's body.

The object is achieved by a coil arrangement, a method for producing a coil arrangement, and a magnetic resonance imaging system.

The coil arrangement for a magnetic resonance imaging system includes at least one coil spacing layer. The coil arrangement may include two coil spacing layers positioned in each case on opposite sides of the coils in the coil arrangement. The at least one coil spacing layer includes a two-dimensional or laminar matrix with a flexible, network structure. The flexible network structure includes a plurality of flexibly interlinked substructures.

Advantageously, the flexible arrangement of the interlinked substructures enables the adaptation of the spacing layer and hence the entire coil arrangement to any shape of an examination object, (for example, a body shape). This enables uniform spacing between the coils and the examination object to be achieved thus facilitating the avoidance of variable-spacing induced artefacts.

With the use, a coil arrangement is used to produce a local coil for a magnetic resonance imaging system. When a coil arrangement is used in a magnetic resonance imaging system, the aforementioned improvements are achieved in the imaging of an examination object.

With the method for producing a coil arrangement, a coil spacing layer is generated that has a two-dimensional or laminar matrix with a flexible, network structure including a plurality of flexibly interlinked substructures. The coil arrangement generated differs from conventional arrangements in that it has the above-described advantages.

The magnetic resonance imaging system includes the coil arrangement and therefore shares the advantages of the coil arrangement.

In one possible embodiment of the coil arrangement, the substructures include perforated components, which are compression-resistant in the vertical direction to the matrix surface. Advantageously, the compression-resistant substructures permit a defined thickness of the coil spacing layer. This enables a defined safety distance between the coils in the coil arrangement and the examination object. In this context, compression-resistant may refer to a structure or layer with a thickness that cannot be altered or may only be altered by a predetermined relatively low percentage, by the customary application of force.

In one conceivable embodiment of the coil arrangement, the substructures are embodied similarly. Advantageously, a similar embodiment of the substructures enables uniform distribution of mechanical properties over the surface of the spacing layer. For example, the spacing layer may be uniformly curved throughout.

In one possible embodiment of the coil arrangement, the coil arrangement includes a local coil. Advantageously, the local coil may be configured to the shape of the examination object so that the induced magnetic resonance signals may be acquired undamped.

In one conceivable embodiment of the coil arrangement, the substructures include one of the following surface shapes: a hexagonal shape, a round shape, a triangular shape, a quadrangular shape, a pentangular shape, or a heptagonal shape.

In one possible embodiment of the coil arrangement, the substructures are connected to one another via flexible connections, which are formed such that individual substructures are able to move away from one another and/or toward one another and/or execute tilting movements and/or rotational movements. These properties permit particularly high flexibility in the adaptation of the coil arrangement to a shape of an examination object.

In one conceivable embodiment of the coil arrangement, the flexible connections form interlocked loop elements. Advantageously, the interlocked loop elements permit high flexibility of the arrangement with simultaneously strong cohesion of the individual components.

In one possible embodiment of the coil arrangement, each flexible connection includes a connector element and a receiver element, wherein the connector element is received by the receiver element. The receiver element may be embodied as a concave element on the outer side of each partial structure. The connector elements may be embodied as arm structures that engage in the concave receiver elements.

In one possible coil arrangement, the two-dimensional or laminar matrix is formed with the aid of a three-dimensional (3D) printing process. Advantageously, the 3D printing process enables the substructures to be produced in one operational act as a coherent overall structure. This type of production advantageously enables time-consuming and labor-consuming assembly of the individual structures to be dispensed with.

In another conceivable embodiment of the coil arrangement, the perforations in the components are embodied such that vertical plug-in connection elements may be fixed in the perforations in a defined grid. The vertical plug-in connection elements enable different layers to be fixed to one another. Moreover, the vertical plug-in connection elements may be used to fix coil elements to the spacing layers. This enables the achievement of a defined spacing between individual coil elements. This creates relatively constant overlap regions and, on the deformation of the arrangement, the coils are held in position thus retaining good decoupling of the individual coils from one another.

In one possible embodiment of the coil arrangement, the vertical plug-in connection elements are configured to connect the coil spacing layer to an outer layer and/or a second coil spacing layer. Advantageously, the outer layer may be fixed on the spacing layer thus enabling the avoidance of slippage of the two layers against each other or unwanted detachment of the outer layer from the spacing layer.

The plug-in connection elements may be configured to receive one or more of electric lines, coil lines, or electronic components extending in the lateral direction. For example, the plug-in connection elements may include passage openings or continuous recesses through which the plug-in connection elements may extend while simultaneously being fixed there.

BRIEF DESCRIPTION OF THE DRAWINGS

Further advantages and details may be derived from the following description of exemplary embodiments in conjunction with the drawings.

FIG. 11 depicts an exemplary schematic representation of hexagonal and round components of a matrix of a spacing layer in a coil arrangement.

DETAILED DESCRIPTION

Figure 1:
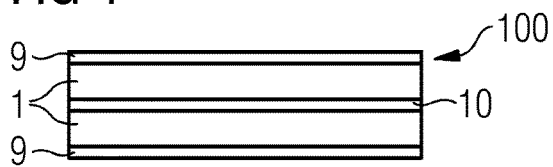
FIG. 1 depicts a cross-sectional view of a section of a coil arrangement according to an exemplary embodiment.

FIG. 1 is a schematic cross-sectional representation of a section of a coil arrangement 100, which is used as a local coil for detecting magnetic-resonance signals. The section has a sandwich structure and includes in its interior a coil layer 10 including a plurality of coil loops in a two-dimensional or laminar arrangement. The coil layer 10 is surrounded on each of its two sides by a spacing layer 1. The spacing layers 1 are each about 5 mm thick and are configured to provide a safety distance between an examination object, (e.g., a patient), and the coil layer 10 and between the coil layer 10 and the outside world, (e.g., the medical staff). Outer layers 9 are applied to each of the outward-facing sides 9 of spacing layers 1 as protective layers.

Figure 2:
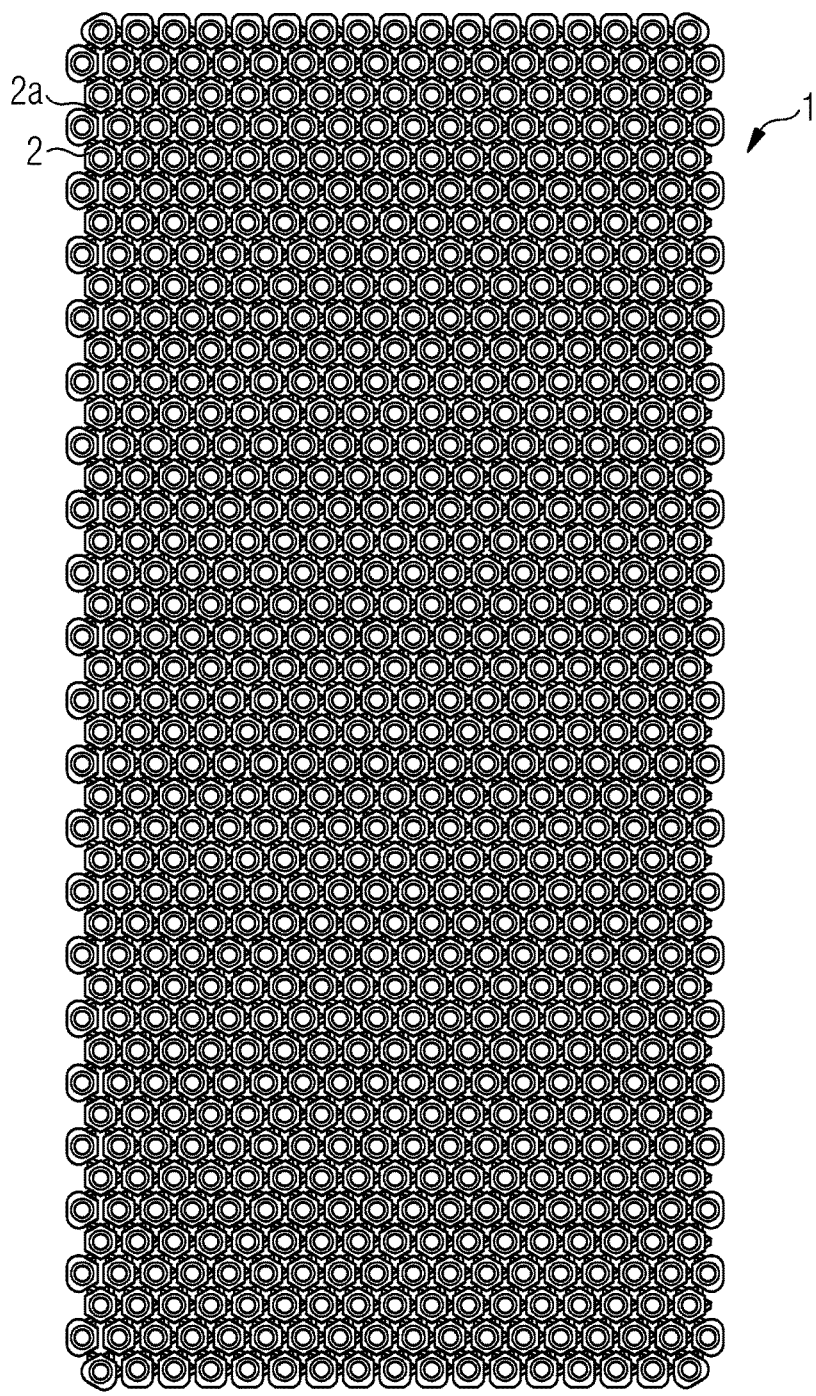
FIG. 2 depicts a top view of an example of a spacing layer in a coil arrangement.

FIG. 2 is a top view of a spacing layer 1 of a local coil matrix with a plurality of perforated components 2. The individual components 2 are connected to one another via flexible connections 2a in a network structure and are incompressible or compression-resistant in the vertical direction to the layer surface so that, by the spacing layer 1, a defined spacing is maintained between coil loops (not shown) applied to the spacing layer 1 and an examination object. The flexible connections 2a enable the spacing layer to be configured to the shape of an examination object.

Herein, the spacing layer 1 is molded onto the surface of the examination object like a type of chainmail.

Figure 3:
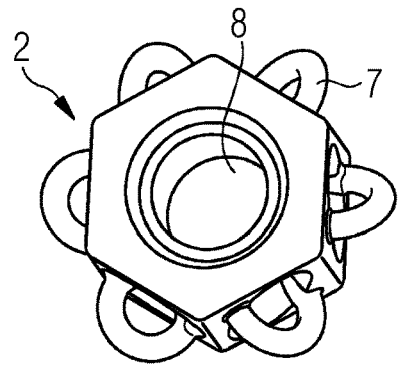
FIG. 3 depicts an example of a schematic representation of an individual component of a matrix of a spacing layer in a coil arrangement.

FIG. 3 depicts a single component 2 of a spacing layer including a hexagonal base body with a circular recess 8 in the center. Connecting elements 7 embodied as loop elements are arranged on each of the six side surfaces of the hexagonal component 2. A three-dimensional printing process may be used to create mutually interlaced loop elements 7 of adjacent components 2 without their having to be manually fitted together or interhooked.

Figure 4:
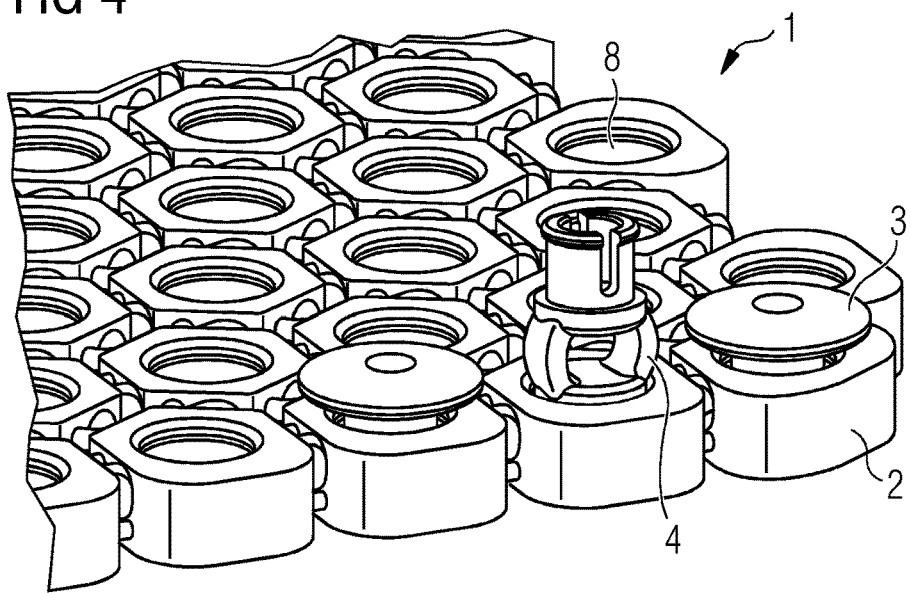
FIG. 4 depicts a perspective representation of a matrix of a spacing layer of an embodiment of a coil arrangement.
Figure 5:
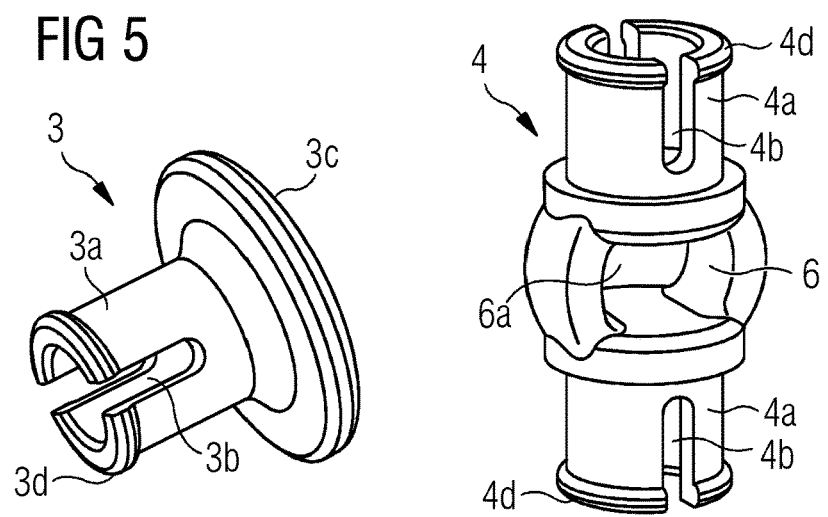
FIG. 5 depicts exemplary schematic representations of vertical plug-in connection elements of a matrix of a spacing layer in a coil arrangement.

FIG. 4 is a perspective view of a matrix of a spacing layer 1. In individual components 2 of the matrix, mushroom-shaped plug-in connection elements 3 and plug-in connection elements 4 embodied as bidirectional connector piece are inserted into the circular recesses 8 of the components 2. These connecting elements 3, 4 are shown enlarged in FIG. 5. A mushroom-shaped plug-in connection element 3 shown on the left side of FIG. 5 includes a tubular shaft 3a with a slot 3b in longitudinal direction. The mushroom-shaped plug-in connection element 3 also includes a disc-shaped head 3c. A type of latching projection with which a positive connection may be formed with a component 2 of a matrix 1 is embodied in a ring shape on the outer edge 3d of the shaft 3a. A right sub-region of FIG. 5 shows a bidirectional connector piece 4 or plug-in connection element with two shafts 4a lying opposite to one another, which are embodied like the shaft 3a of the mushroom-shaped plug-in connection element 3 with slots 4b and latching projections 4d. The connector piece 4 also includes a feed-through part 6 embodied between the two shafts 4a with a continuous recess 6a through which it is possible to run electric lines and electronic components.

Figure 6:
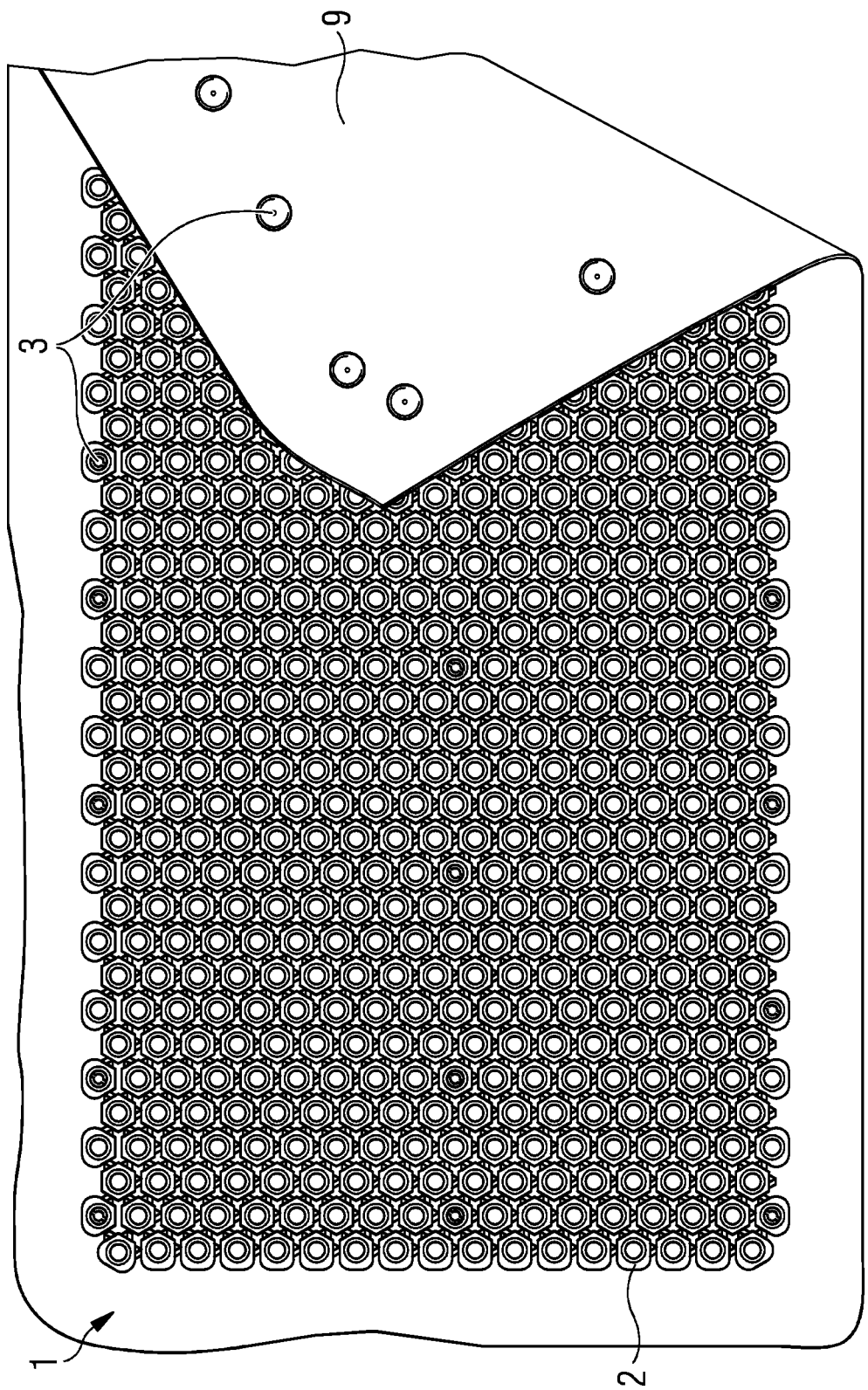
FIG. 6 depicts an exemplary representation of a combination of a spacing layer and an outer layer.

FIG. 6 depicts a matrix of a spacing layer 1 including a plurality of mushroom-shaped plug-in connection elements 3, which are used to hold an outer layer 9. The shafts 3a of the mushroom-shaped plug-in connection elements 3 are inserted into individual components 2 of the matrix and the heads 3c of the mushroom-shaped plug-in connection elements 3 hold the outer layer 9 in a positive fitting manner on the spacing layer 1. Here, recesses with diameters approximately corresponding to a diameter of a shaft 3a of a mushroom-shaped plug-in connection element 3 are formed in the outer layer 9.

Figure 7:
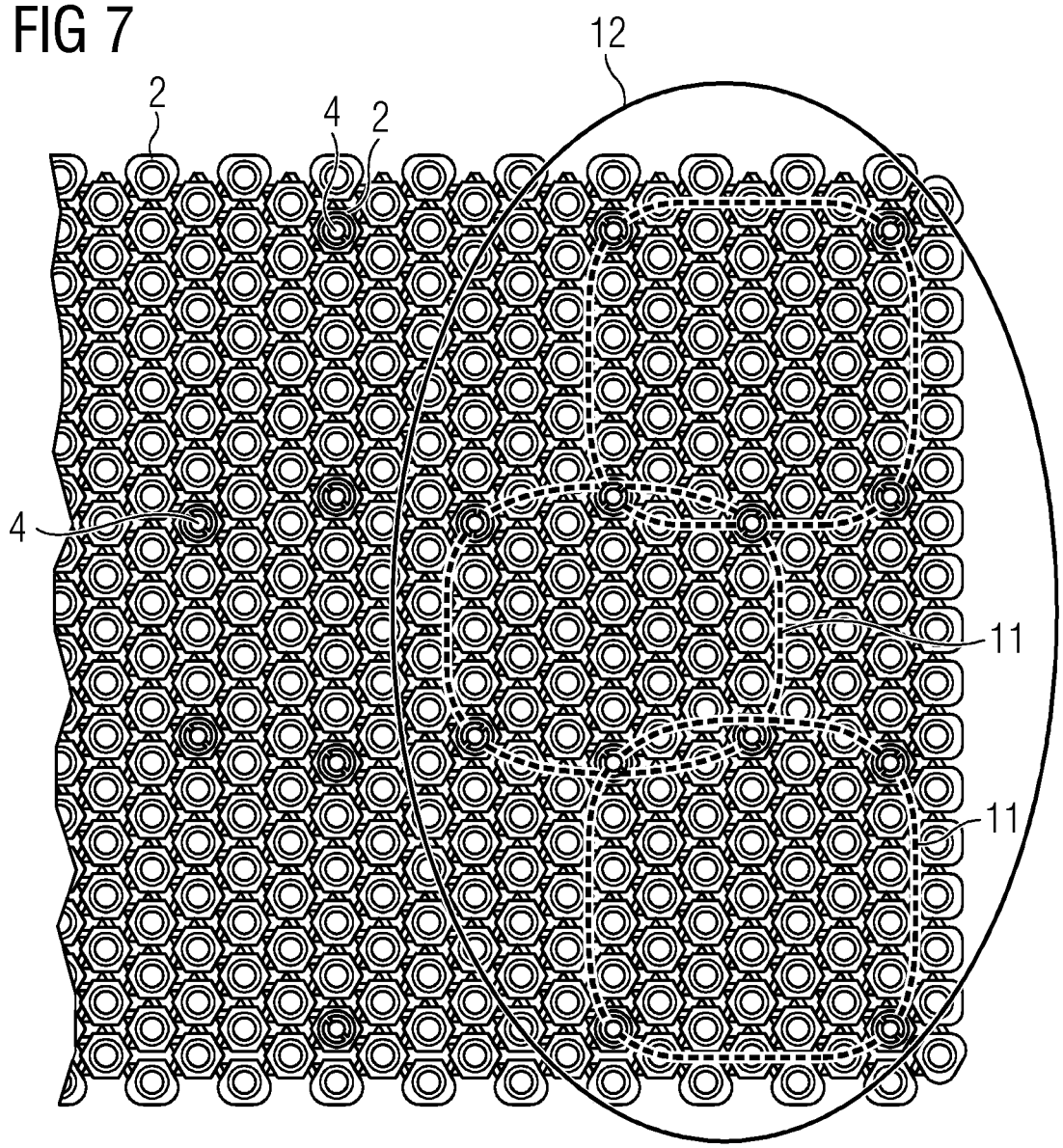
FIG. 7 depicts a top view of an example of a matrix of a spacing layer with a plurality of connector pieces.

FIG. 7 is a top view of a spacing layer 1. Connector pieces 4 are inserted into individual components 2. In a sub-region 12 of the spacing layer 1, dashed lines indicate coil lines in the form of coil loops 11 extending through the recesses 6a (e.g., see FIG. 5) of the feed-through parts 6 of connector pieces 4.

Figure 8:
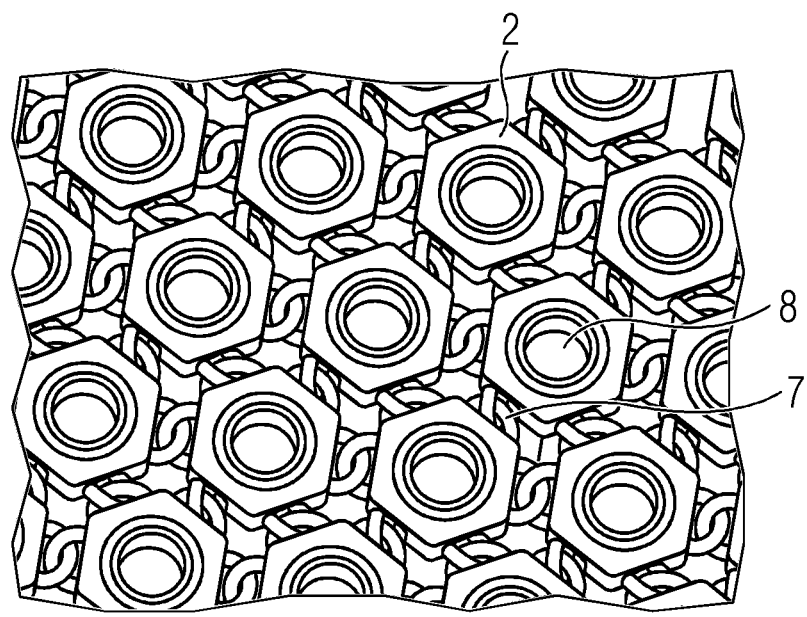
FIG. 8 depicts an exemplary enlarged representation of a segment of a matrix of a spacing layer.

FIG. 8 depicts individual components 2 of a spacing layer in enlarged form. This illustrates the internal circular recesses 8 of the individual components 2 and the loop elements 7 of adjacent components 2, which are interlaced with each other.

Figure 9:
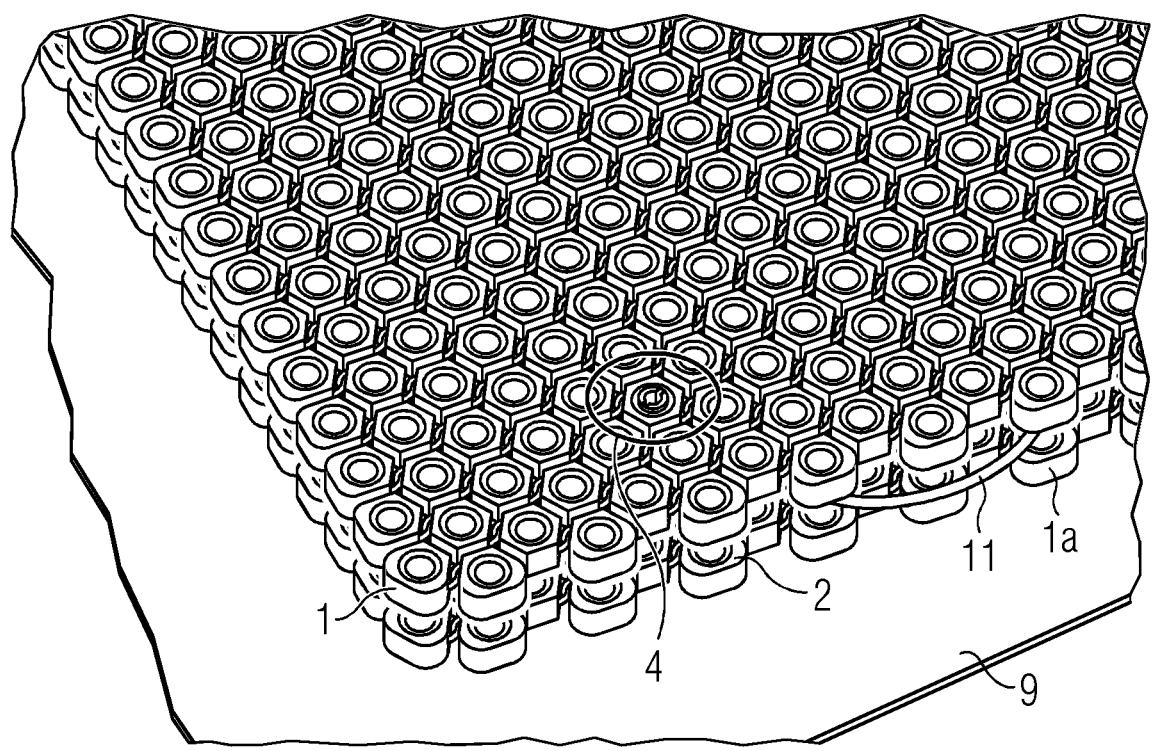
FIG. 9 depicts an example of a coil arrangement with a coil loop protruding at the side edge between two spacing layers.

FIG. 9 illustrates a layer sequence including an outer layer 9, a first spacing layer 1a, a coil layer, and a second spacing layer 1. The outer layer 9 is connected to the first spacing layer 1a by mushroom-shaped plug-in connection elements (not shown). FIG. 9 also illustrates a coil loop 11 protruding on the side edge, which, in the coil layer 10, lies between the two spacing layers 1, 1a.

Figure 10:
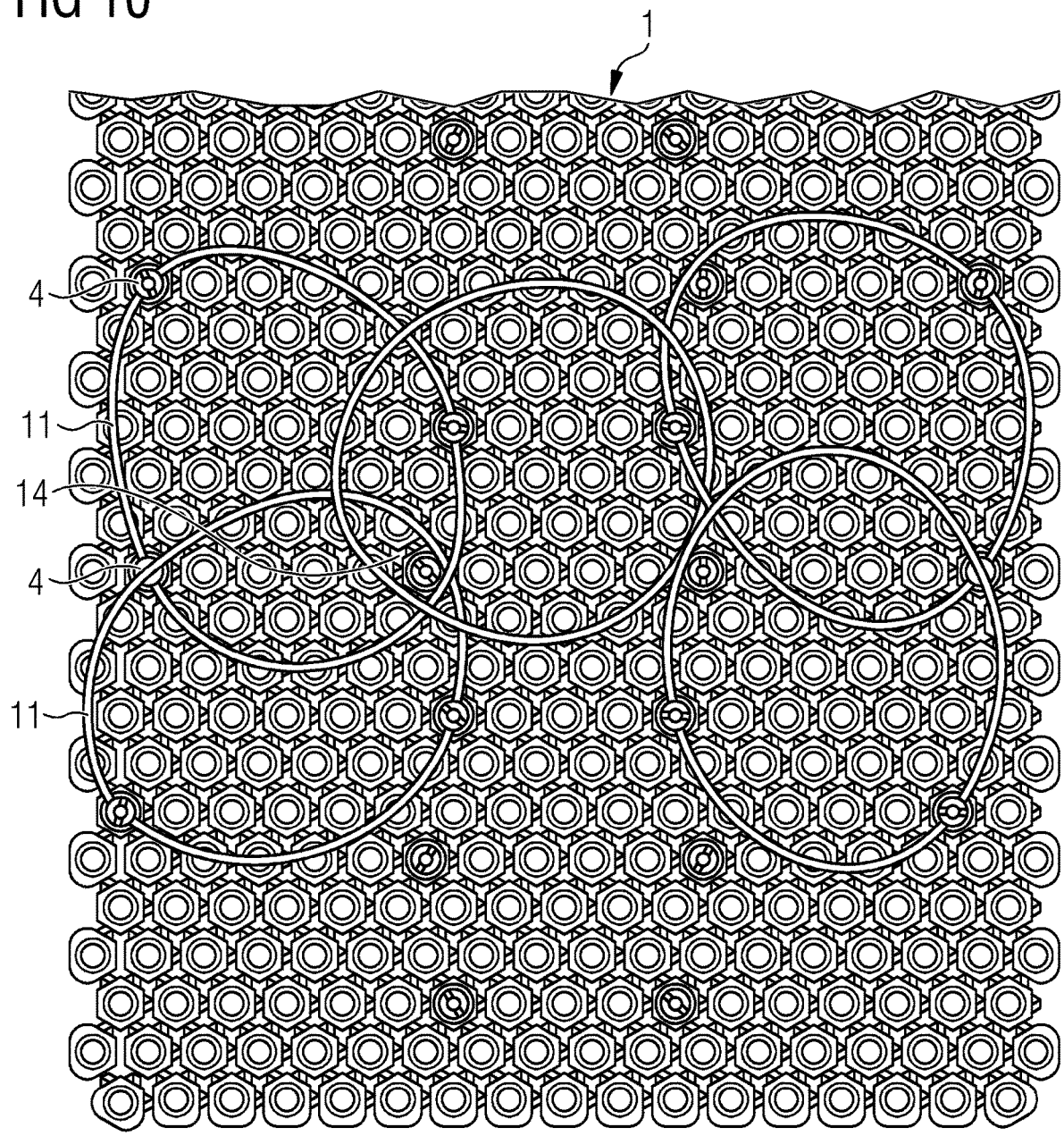
FIG. 10 depicts an exemplary representation of coil loops arranged on a spacing layer.

FIG. 10 illustrates coil loops 11 which are arranged on a spacing layer 1 and are fixed on the spacing layer 1 by connector pieces 4 or bidirectional plug-in connection elements. The coil loops 11 form overlap regions 14. The fixing of the coil loops 11 results in relatively constant overlap regions 14 and, on deformation of the matrix of the spacing layer 1, these are held in position in order to obtain the best possible decoupling with respect to one another. The connector pieces 4 are not only able to hold coil lines in position, they may also serve as holders for other electronic components.

FIG. 11 depicts hexagonal and round components 22, 23 of a matrix of a spacing layer that, unlike the components 2 described above, were produced as individual elements and then brought into connection with one another by so-called connector elements 25 and receiver elements 26 integrated in the respective components 22, 23 in order to form a matrix of a spacing layer. By way of example, FIG. 11 in each case shows a segment or a composite 21 of three hexagonal components 22 and three round components 23 in each case. On assembly, the connector elements 25 are latched, hooked or pressed into the receiver elements 26. To this end, the connector elements 25 include a rear-hook or latching element 28 that may be pushed into the receiver elements 26 and is spread open behind the receiver elements and may be connected there in an irreversible or dimensionally stable manner while still permitting movement in the longitudinal direction 15. For this purpose, the connector elements 25 may be slightly elastic. Alternatively, or additionally, the receiver element 26 may have a little play in order to enable not only movements apart but also tilting and torsional movements, thus achieving increased adaptability of the shape of the matrix of the spacing layer.

Figure 12:
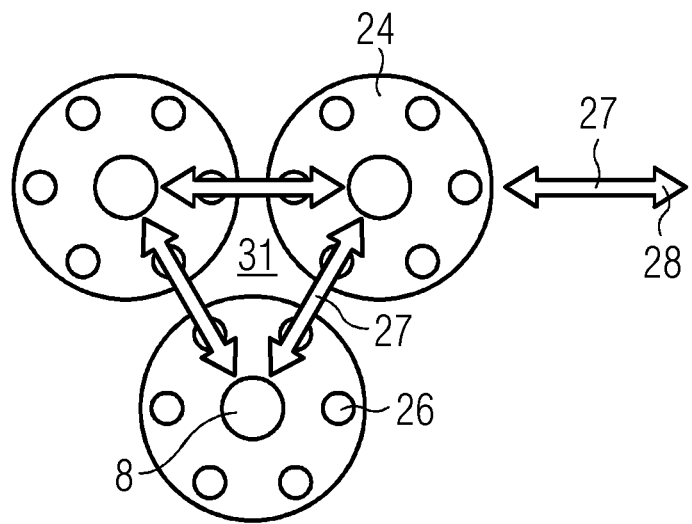
FIG. 12 depicts an exemplary schematic representation of round individual elements of a matrix of a spacing layer in a coil arrangement with coupling elements.

FIG. 12 depicts round individual elements 24, which, unlike the individual elements 22, 23 shown in FIG. 11, do not include any connector elements 25 but only possess receiver elements 26. Additionally, assembly of the individual elements 24 requires coupling elements 27 with which the individual elements 24 are joined to form a composite 31. Such joining may be performed either mechanically or manually. At both ends, the coupling elements 27 each include rear-hook or latching elements 28, with which the coupling elements 27 are connected on one side to an individual element 24. Different materials may be selected for the coupling elements 27 and the individual elements 24. This enables components to be optimized in accordance with the respective requirements. Holding points 8 enable the outer layer to be held firmly or electronic components to be fixed.

Figure 13:
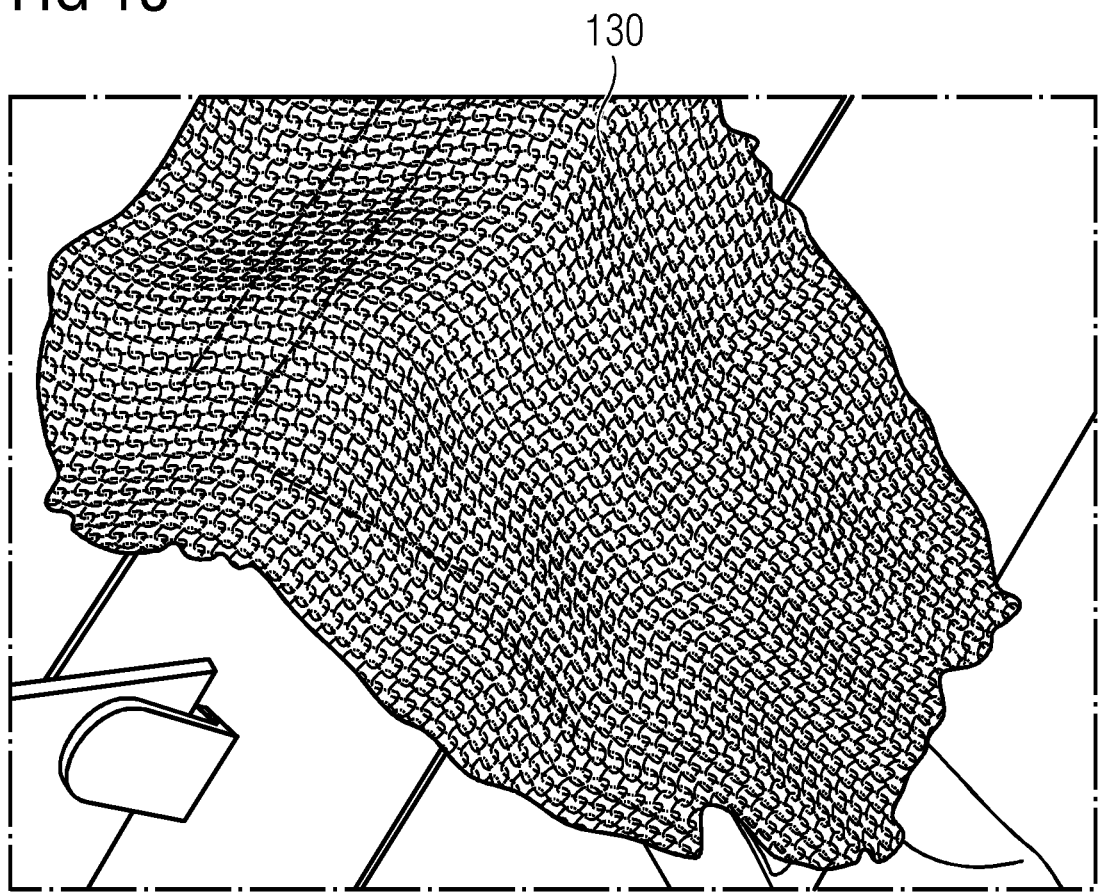
FIG. 13 depicts an exemplary representation of a spacing layer with substructures, wherein their flexible connections include interlocked loop elements.

FIG. 13 is a representation of a spacing layer 130 including substructures with flexible connections that form interlocked loop elements. When combined with an outer cover, this spacing layer 130 may be configured to any body shape and, while completely flexible, cannot be indented, so that despite high flexibility and shapeability, a safety distance from the patient is provided. Possible materials to use for this spacing layer are, for example, thermoplastic polyurethanes, which are, for example, sold under the trademark "Luvosint". These are deformable during production, but compression-resistant after curing.

Figure 14:
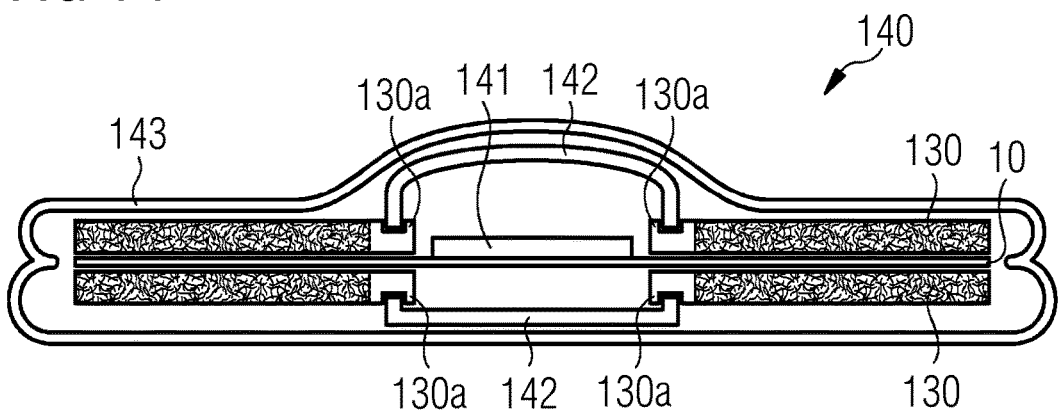
FIG. 14 depicts a cross-sectional view of a coil matrix with the spacing layer illustrated in FIG. 13.

FIG. 14 is a cross-sectional view of a coil matrix 140 or coil arrangement with two spacing layers 130 arranged in a sandwich structure corresponding to the structure of a spacing layer 130 illustrated in FIG. 13. The coil matrix 140 includes a coil layer 10 between the two spacing layers 130 with one or more local coils (not shown). The coil layer 10 is electrically connected to a printed circuit board 141 including the electronics required for the activation of the local coils, (e.g., preamplifiers). The printed circuit board 141 is protected against damage by a housing 142. The housing 142 is attached to a frame 130a, which is integrated in the respective spacing layer 1 and surrounds the printed circuit board 141. An outer layer 143 is arranged on the outer side of the spacing layer 130 as a protective cover. The outer layer 143 may be made of viscoelastic polyethylene and have a thickness of about 2 mm.

Figure 15:
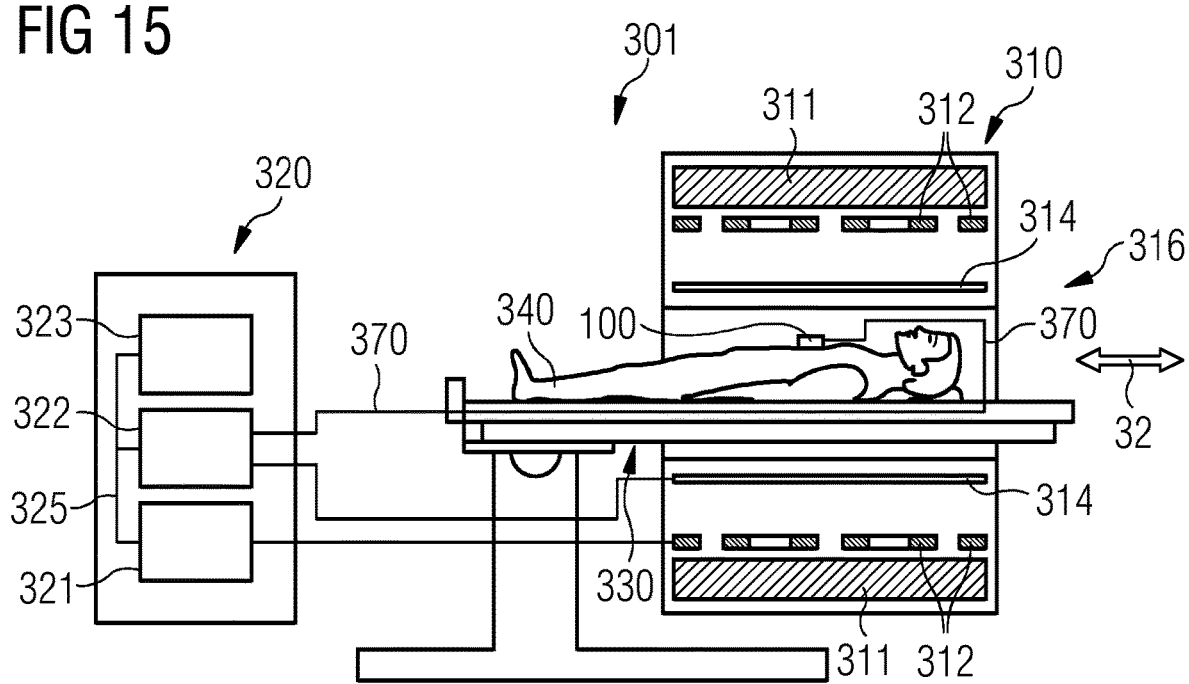
FIG. 15 depicts an exemplary schematic view of a magnetic resonance scanner.

FIG. 15 is a schematic representation of an embodiment of a magnetic resonance scanner 301 with a coil arrangement 100.

The magnet unit 310 has a field magnet 311 that generates a static magnetic field BO for the alignment of nuclear spins in specimens or in a body of a patient 340 in a receiving region. The receiving region is arranged in a patient tunnel 316 extending in a longitudinal direction 302 through the magnet unit 310. The field magnet 311 may be a superconducting magnet that is able to provide magnetic fields with a magnetic flux density of up to 3 Tesla (T), or even more with the most recent devices. However, it is also possible to use permanent magnets or electromagnets with normally conducting coils for lower field strengths.

The magnet unit 310 also includes gradient coils 312 designed to superimpose the magnetic field BO with variable magnetic fields in three directions for the spatial differentiation of the image regions acquired in the examination volume. The gradient coils 312 may be coils made of normally conducting wires able to generate fields that are orthogonal to one another in the examination volume.

The magnet unit 310 also includes a body coil 314 designed to emit a radio-frequency signal supplied via a signal line into the examination volume and to receive resonance signals emitted by the patient 340 and emit them via a signal line. The magnetic resonance scanner also includes one or more coil arrangements 100 according to an exemplary embodiment, which are arranged in the patient tunnel 316 close to the patient 340.

A control unit 320 supplies the magnet unit 310 with the different signals for the gradient coils 312 and the body coil 314 and evaluates the received signals.

Hence, the control unit 320 includes a gradient activation system 321 designed to supply the gradient coils 312 via leads with variable currents that provide the desired gradient fields in the examination volume in temporal coordination.

The control unit 320 also includes a radio-frequency unit 322 designed to generate a radiofrequency pulse with a prespecified temporal course, amplitude and spectral power distribution in order to excite a magnetic resonance of the nuclear spins in the patient 340. This enables a pulse power in the kilowatt range to be achieved. The individual units are connected to one another by a signal bus 325.

The radio-frequency signal generated by the radio-frequency unit 322 is supplied to the patient bench 300 via a signal connection 331 and distributed at one or more local coils and emitted into the body of the patient 340 in order to excite the nuclear spins there.

The local coil of the coil arrangement 100 may receive a magnetic resonance signal from the body of the patient 340 because, due to the short distance, the signal-to-noise ratio (SNR) of the local coil is better than with reception by the body coil 314. The MR signal received by the local coil is conditioned in the local coil and forwarded to the radio-frequency unit 322 of the magnetic resonance scanner 301 for evaluation and image acquisition. The signal connection 331 may also be used for this, but separate signal connections or wireless transmission are also conceivable. It is also conceivable for special local coils or other antennas to be used for reception.

Finally, reference is made once again to the fact that the above-described devices and methods are only exemplary embodiments and that the disclosure may be varied by the person skilled in the art without leaving the scope of the disclosure as specified in the claims. For purposes of completeness, reference is also made to the fact that the use of the indefinite article "a" or "an" does not preclude the possibility that the features in question may also be present on a multiple basis. Similarly, the term "unit" does not preclude the possibility that the unit includes a plurality of components, which may also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A coil arrangement for a magnetic resonance imaging system, the coil arrangement comprising:
   at least one coil spacing layer having a two-dimensional matrix with a flexible, network structure,
   wherein the flexible, network structure comprises a plurality of flexibly interlinked perforated components, wherein the perforated components are compression-resistant in a vertical direction to a surface of the two-dimensional matrix.

2. The coil arrangement of claim 1, wherein perforations in the perforated components are embodied such that vertical plug-in connection elements are configured to be fixed in the perforations in a defined grid.

3. The coil arrangement of claim 2, wherein the vertical plug-in connection elements are configured to connect the coil spacing layer to an outer layer, a second coil spacing layer, or both the outer layer and the second coil spacing layer.

4. The coil arrangement of claim 3, wherein the vertical plug-in connection elements are configured to receive one or more of electric lines, coil lines, or electronic components extending in a lateral direction.

5. The coil arrangement of claim 2, wherein the vertical plug-in connection elements are configured to receive one or more of electric lines, coil lines, or electronic components extending in a lateral direction.

6. The coil arrangement of claim 1, wherein each perforated component is similar to each additional perforated component of the plurality of flexibly interlinked perforated components.

7. The coil arrangement of claim 1, further comprising:
   a local coil.

8. The coil arrangement of claim 1, wherein each perforated component of the plurality of flexibly interlinked perforated components comprises one of the following surface shapes: a hexagonal shape, a round shape, a triangular shape, a quadrangular shape, a pentangular shape, or a heptagonal shape.

9. The coil arrangement of claim 1, wherein each perforated component of the plurality of flexibly interlinked perforated components are connected to one another via flexible connections, wherein the flexible connections are configured such that individual perforated components are able to: move away from one another, move toward one another, execute tilting movements, execute rotational movements, or a combination thereof.

10. The coil arrangement of claim 9, wherein the flexible connections form interlocked loop elements.

11. The coil arrangement of claim 10, wherein each flexible connection comprises a connector element and a receiver element, wherein the connector element is received by the receiver element.

12. The coil arrangement of claim 9, wherein each flexible connection comprises a connector element and a receiver element, wherein the connector element is received by the receiver element.

13. The coil arrangement of claim 1, wherein the two-dimensional matrix is formed via a three-dimensional (3D) printing process.

14. A method for producing a coil arrangement, the method comprising:

generating a coil spacing layer having a two-dimensional matrix with a flexible, network structure, which comprises a plurality of flexibly interlinked perforated components, wherein the perforated components are compression-resistant components in a vertical direction to a surface of the two-dimensional matrix, and wherein the two-dimensional matrix is formed via a three-dimensional (3D) printing process.

15. A magnetic resonance imaging system comprising:

a local coil; and at least one coil spacing layer having a two-dimensional matrix with a flexible, network structure, wherein the flexible, network structure comprises a plurality of flexibly interlinked perforated components, wherein the perforated components are compression-resistant in a vertical direction to a surface of the two-dimensional matrix.

\* \* \* \* \*